United States Patent
Zacharko et al.

(10) Patent No.: US 9,642,240 B2
(45) Date of Patent: May 2, 2017

(54) PRINTED CIRCUIT BOARD ASSEMBLIES AND A WELLBORE SYSTEM

(71) Applicant: Halliburton Energy Services, Inc., Houston, TX (US)

(72) Inventors: Jonathan Peter Zacharko, Spring, TX (US); Ronny Ariel Ozeri, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 14/811,879

(22) Filed: Jul. 29, 2015

(65) Prior Publication Data

US 2016/0057853 A1    Feb. 25, 2016

Related U.S. Application Data

(60) Provisional application No. 62/039,475, filed on Aug. 20, 2014.

(51) Int. Cl.
*H05K 7/00*   (2006.01)
*H05K 1/02*   (2006.01)
(Continued)

(52) U.S. Cl.
CPC ............ *H05K 1/0265* (2013.01); *E21B 7/04* (2013.01); *E21B 41/00* (2013.01); *E21B 47/00* (2013.01);
(Continued)

(58) Field of Classification Search
CPC ...... H01L 23/4006; H01L 2924/01079; H05K 1/0263; H05K 2201/10689
(Continued)

(56) References Cited

U.S. PATENT DOCUMENTS 8,507,802 B1    8/2013   Knauer
8,649,179 B2    2/2014   Hershberger et al.
(Continued)

FOREIGN PATENT DOCUMENTS

JP    11312849         11/1999
WO    2016028451 A1    2/2016

OTHER PUBLICATIONS

International Search Report and Written Opinion for PCT/US2015/042570 dated Nov. 6, 2015.

*Primary Examiner* — Tuan T Dinh
(74) *Attorney, Agent, or Firm* — McDermott Will & Emery LLP (57) ABSTRACT

Printed circuit board assemblies having capabilities for operating under high ampacity conditions are sometimes difficult to fabricate and lack sufficient mechanical robustness for extreme operating environments. Accordingly, printed circuit board assemblies comprise: a non-conductive substrate having a plurality of planar conductive pathways disposed thereon; an electronic component that is in electrical communication with one or more of the planar conductive pathways and is configured to supply an electrical current thereto; a superficial metallic conductor overlaying one or more of the planar conductive pathways, at least in part, the superficial metallic conductor having an electrical connection to the electronic component and also being in electrical communication with the planar conductive pathways; and a conductive element in electrical communication with the superficial metallic conductor, the conductive element being configured to withdraw electrical current from the printed circuit board assembly.

19 Claims, 5 Drawing Sheets

(51) Int. Cl.
    *E21B 41/00*     (2006.01)
    *E21B 47/00*     (2012.01)
    *E21B 7/04*     (2006.01)
    *H05K 1/09*     (2006.01)

(52) U.S. Cl.
    CPC ..... *H05K 1/09* (2013.01); *H05K 2201/10272* (2013.01)

(58) Field of Classification Search
    USPC ......... 361/707, 760, 775–778, 813; 439/76.2
    See application file for complete search history.

(56) References Cited

U.S. PATENT DOCUMENTS

| | | | |
|---|---|---|---|
| 2005/0016771 A1* | 1/2005 | Mayes | E21B 47/00 |
| | | | 175/48 |
| 2008/0146092 A1* | 6/2008 | Taylor | H01R 11/26 |
| | | | 439/883 |
| 2008/0268671 A1* | 10/2008 | Harris | H01H 85/046 |
| | | | 439/76.2 |
| 2009/0033443 A1 | 2/2009 | Greed | |
| 2011/0011635 A1 | 1/2011 | Ondelj | |
| 2011/0031015 A1* | 2/2011 | Downton | E21B 47/12 |
| | | | 175/27 |
| 2011/0278643 A1* | 11/2011 | Sato | H01L 23/367 |
| | | | 257/140 |
| 2012/0236504 A1* | 9/2012 | Wortberg | H01L 23/3735 |
| | | | 361/707 |

\* cited by examiner

PRINTED CIRCUIT BOARD ASSEMBLIES AND A WELLBORE SYSTEM

CROSS-REFERENCE TO RELATED APPLICATIONS

The present application claims the benefit of priority under 35 U.S.C. §119 from U.S. Provisional Patent Application 62/039,475, filed on Aug. 20, 2014.

BACKGROUND

The present disclosure generally relates to printed circuit board assemblies and, more specifically, to printed circuit board assemblies configured for handling high-current loads and methods for their production.

Modern drilling and production operations often demand acquisition of significant quantities of information relating to the downhole environment. The collection of such information is commonly referred to as "logging." When performed during a drilling operation, the logging process is often referred to more specifically as "logging while drilling (LWD)" or "measurement while drilling (MWD)." Information collected during a logging process may include, for example, the physical location and orientation of the borehole and drilling assembly, properties of the subterranean formation penetrated by a wellbore, and/or the physical and chemical conditions present in the wellbore. More specific examples of data collected during a logging process can include, for example, resistivity, conductivity, temperature, pressure, rotation, inclination, measurement of radioactive substances, magnetic measurements, acoustic measurements, seismic activity and the like.

Considerable information may also be needed to drive a drilling tool in a desired manner, particularly when conducting a directional drilling operation under the control of surface equipment. Data similar to that of a logging operation may be used for this purpose. A drilling tool for conducting a directional drilling operation will be referred to herein as a "rotary steerable drilling tool." Rotary steerable drilling tools may also be used in conjunction with logging while drilling operations.

A variety of sensors and equipment may be employed during logging and directional drilling operations. Many of these devices employ fairly complex electrical circuitry. To dispose the electrical circuitry in a reasonably compact operating package, printed circuit boards (PCBs) are frequently used. As used herein, the term "printed circuit board (PCB)" will refer to an electronic structure having a plurality of planar conductive pathways (i.e., "conductive lines" or "pads") disposed laterally upon a substantially non-conductive substrate. Various electronic components (i.e., transistors, resistors, capacitors, diodes, inductors, and the like) may be mechanically supported by the PCB such that they are electrically interconnected via the planar conductive pathways to produce one or more circuits that function in a desired manner. A high-current source may further supply an electrical input to the planar conductive pathways of a PCB. The term "printed circuit board assembly (PCB assembly)" will refer herein to the combination of a high-current source in electrical communication with a PCB.

The planar conductive pathways of PCBs may be disposed upon one or both sides of the non-conductive substrate, such that the PCB is single-sided or double-sided, respectively. Multiple non-conductive substrates may also be stacked upon themselves to form a multi-layered PCB. Multi-layered PCBs may be used to establish a high density of electronic circuitry per unit of operating space.

PCBs may be manufactured by laminating a metal foil or sheet, particularly copper, onto a non-conductive substrate and then etching away portions of the metal to define the planar conductive pathways on the substrate in one or more desired locations. Such processes are often referred to as being "subtractive," since they remove metal in the course of forming the planar conductive pathways. Alternately, an ink jet printing process may be used to define the planar conductive pathways by disposing a conductive ink on the non-conductive substrate. Such processes are often referred to as being "additive," since they add metal in the course of forming the planar conductive pathways. With both additive and subtractive processes, it is often very difficult to vary the thickness of the planar conductive pathways in a controllable manner at different locales within a PCB.

Both additive and subtractive processes may be satisfactorily used to form planar conductive pathways that are up to about 100 microns in thickness. Planar conductive pathways within this thickness range can provide acceptable PCB functionality in many instances. However, when certain high-current sources are coupled to a PCB assembly, such thin planar conductive pathways can frequently be insufficient to provide the desired ampacity. In such instances, thicker conductive pathways can be desirable in order to increase the amount of current that may be effectively carried. In the case of planar conductive pathways formed from copper, the PCB industry typically refers to copper thicknesses greater than about 100 microns as representing "thick copper" or "heavy copper."

Unlike planar conductive pathways suitable for carrying lower amounts of current, conductive pathway thicknesses above about 100 microns can be much more difficult to achieve. Specifically, it can be difficult to controllably deposit thicker conductive pathways with uniform thicknesses over the entirety of the PCB. It can also be difficult to solder electronic components to thicker conductive pathways. Added weight from uniformly thick conductive pathways across the entirety of the PCB can also be a concern in some high-performance applications. In some instances, thicker conductive pathways may be combined with an electrically isolated but thermally conductive plate to facilitate thermal dissipation and improve ampacity, although this technology is somewhat costly and may compromise one's ability to form multi-layered PCBs.

As an alternative to using thicker planar conductive pathways within PCBs, multi-layered PCBs may be used to distribute high-current loads between multiple layers. However, this approach has limitations as well. Specifically, the multiple layers can make soldering a challenge, and failure of any one of the multiple PCB layers can result in failure of the entire PCB. Failure within the internal layers of a multi-layered PCB can be particularly problematic, since these layers are generally unable to dissipate heat as effectively as the outer layers.

Bus bars or related structures may also be connected to a PCB assembly for withdrawing high-current loads therein. However, one still needs to provide a robust pathway for carrying electrical current to the bus bar or similar structure, so bus bar approaches may likewise be limited by problematic deposition of conductive pathways of suitable thickness, as discussed above. This limitation may be circumvented in some instances by embedding the bus bar directly in the non-conductive substrate, although specialized, high-cost manufacturing processes may be needed. In addition, there can be a significant risk of mechanical failure due to delamination or decoupling of the bus bar during thermal expansion and/or vibration under extreme operating conditions.

PCB assemblies destined for use in a downhole environment may be subject to a number of challenging operating conditions including, for example, high and varying temperatures, extreme pressures, and/or vibration, any of which can result in failure of a PCB assembly and commensurate loss of downhole monitoring and control. The extreme operating conditions of downhole environments can be particularly challenging to address when providing a PCB assembly configured for accommodating a high-current load.

BRIEF DESCRIPTION OF THE DRAWINGS

The following figures are included to illustrate certain aspects of the present disclosure and should not be viewed as exclusive embodiments. The subject matter disclosed is capable of considerable modifications, alterations, combinations, and equivalents in form and function, as will occur to one having ordinary skill in the art and the benefit of this disclosure.

DETAILED DESCRIPTION

The present disclosure generally relates to printed circuit board assemblies and, more specifically, to printed circuit board assemblies configured for handling high-current loads and methods for their production.

One or more illustrative embodiments incorporating the features of the present disclosure are presented herein. Not all features of a physical implementation are necessarily described or shown in this application for the sake of clarity. It is to be understood that in the development of a physical implementation incorporating the embodiments of the present disclosure, numerous implementation-specific decisions may be made to achieve the developer's goals, such as compliance with system-related, business-related, government-related and other constraints, which may vary by implementation and from time to time. While a developer's efforts might be time-consuming, such efforts would be, nevertheless, a routine undertaking for one having ordinary skill in the art and the benefit of this disclosure.

As discussed above, it can be difficult to fabricate conductive pathways in PCBs such that they can effectively carry high-current loads. Even overcoming the manufacturing challenges associated with producing such PCBs, deployment conditions for the PCBs may be challenging and operational failure may result. Despite these difficulties, certain high-current electronic components can remain highly desirable for use in PCBs.

The present inventors discovered facile techniques whereby PCBs may be readily modified to establish one or more conductive pathways configured for carrying high-current loads, such as in PCB assemblies containing an electronic component that may supply a high electrical current to the PCB. Most advantageously, these techniques may be coupled to existing PCB manufacturing techniques without adding significantly to the time or cost of production. The disclosed techniques may also facilitate ready incorporation of a bus bar or similar current-withdrawing structure within the PCB architecture. Furthermore, the PCB architecture resulting from the disclosure herein may allow the PCBs to remain operationally robust, even under extreme operating conditions.

The present inventors discovered that PCBs may be effectively modified in locations where increased current-carrying capabilities are needed by overlaying a superficial metallic conductor upon one or more of the planar conductive pathways, at least in part. As used herein, the term "superficial metallic conductor" will refer to a conductive layer or monolith that is in direct contact with an existing planar conductive pathway in a PCB and extends further above the plane of the non-conductive substrate than does the existing planar conductive pathway. That is, the overlaid planar conductive pathway portions are interposed between the non-conductive substrate and the superficial metallic conductor, such that the overlaid planar conductive pathways have an increased effective thickness where the superficial metallic conductor is present. As used herein, the term "at least in part" will refer to a portion of a planar conductive pathway or a whole planar conductive pathway. Advantageously, the superficial metallic conductor can establish good electrical communication with the overlaid planar conductive pathways, thereby maintaining the initial electrical operating principles of the PCB. Accordingly, the PCBs of the present disclosure can accommodate localized high currents where the superficial metallic conductor is present, while still maintaining a low-current conductive pathway in the planar conductive pathways. Thus, the original electrical operating principles of the PCB may be maintained by practicing the disclosure herein. The superficial metallic conductor may be in any desired shape and have a thickness suitable for carrying an expected current within the PCB. The superficial metallic conductor may further carry excess electrical current to a bus bar or like structure to facilitate removal of current from the PCB.

As indicated above, the PCBs described herein advantageously may carry localized high electrical currents in regions where the superficial metallic conductor is present. Since the superficial metallic conductor may be overlaid on only a portion of the planar conductive pathways in order to provide a localized high-current pathway where needed, significant weight and materials savings may be realized compared to "thick copper" or similar metal layers extending over the entirety of the PCB. Since the superficial metallic conductor can be separately added to the PCBs after their fabrication, uniformity issues associated with additive or subtractive approaches may also be averted by controllably introducing a thicker conductive pathway only in a location where it is most needed. Hence, the PCBs of the present disclosure may provide a designed high-current pathway to a bus bar or similar structure, while still maintaining a low-current pathway that is minimally modified from the original PCB architecture.

The PCBs of the present disclosure are further advantageous since the superficial metallic conductor can provide a robust location for attachment of a bus bar to the PCB. Mechanical attachment of a bus bar to the PCB can provide a strong connection that may withstand challenging operating conditions, while still maintaining the bus bar in electrical communication with the PCB. Further details regarding mechanical attachment of a bus bar to the PCB, as well as alternative attachment strategies, will be discussed hereinbelow. By attaching a bus bar or like conductive element to the PCB in the manner described herein, delamination and other mechanical stability issues associated with the bus bar may be largely averted.

The PCBs and PCB assemblies described herein may be particularly advantageous for use in challenging operating environments, such as those encountered downhole. Accordingly, the PCBs and PCB assemblies of the present disclosure may be readily employed for controlling equipment used in downhole operations such as well logging, LWD, directional drilling, or in other downhole operations in which electronically controllable downhole tools are used. Although the PCBs and PCB assemblies of the present disclosure may be particularly suitable for downhole use, they may also be used in any situation where it is desirable to conduct high currents within a PCB. For example, the PCBs and PCB assemblies described herein may be used in electronic appliances, computers, printers, televisions, stereos, digital clocks, telephones, and any other devices that utilize conventional PCBs.

Figure 1:
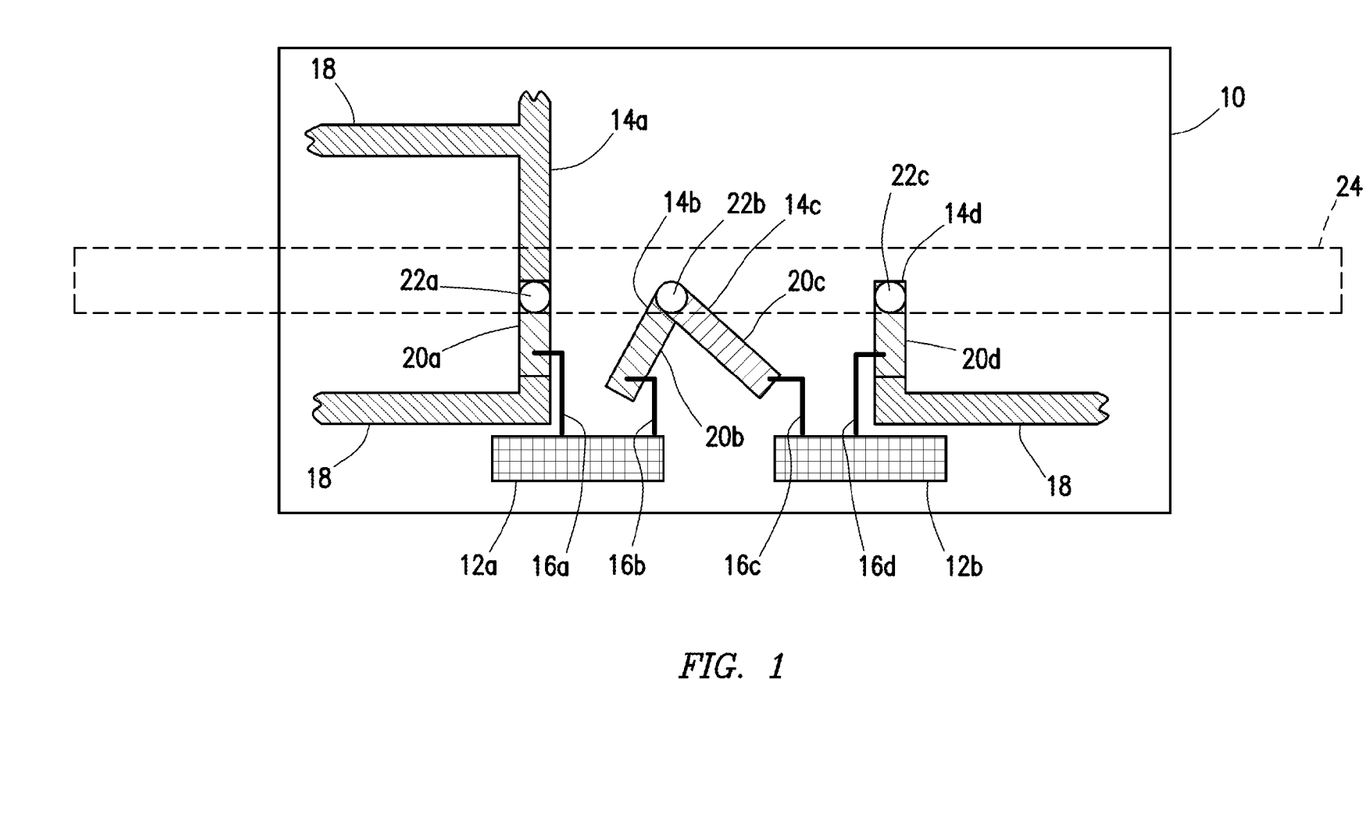
FIG. 1 is a diagram showing an illustrative PCB assembly of the present disclosure in which electronic components are mounted upon a non-conductive substrate.
Figure 2:
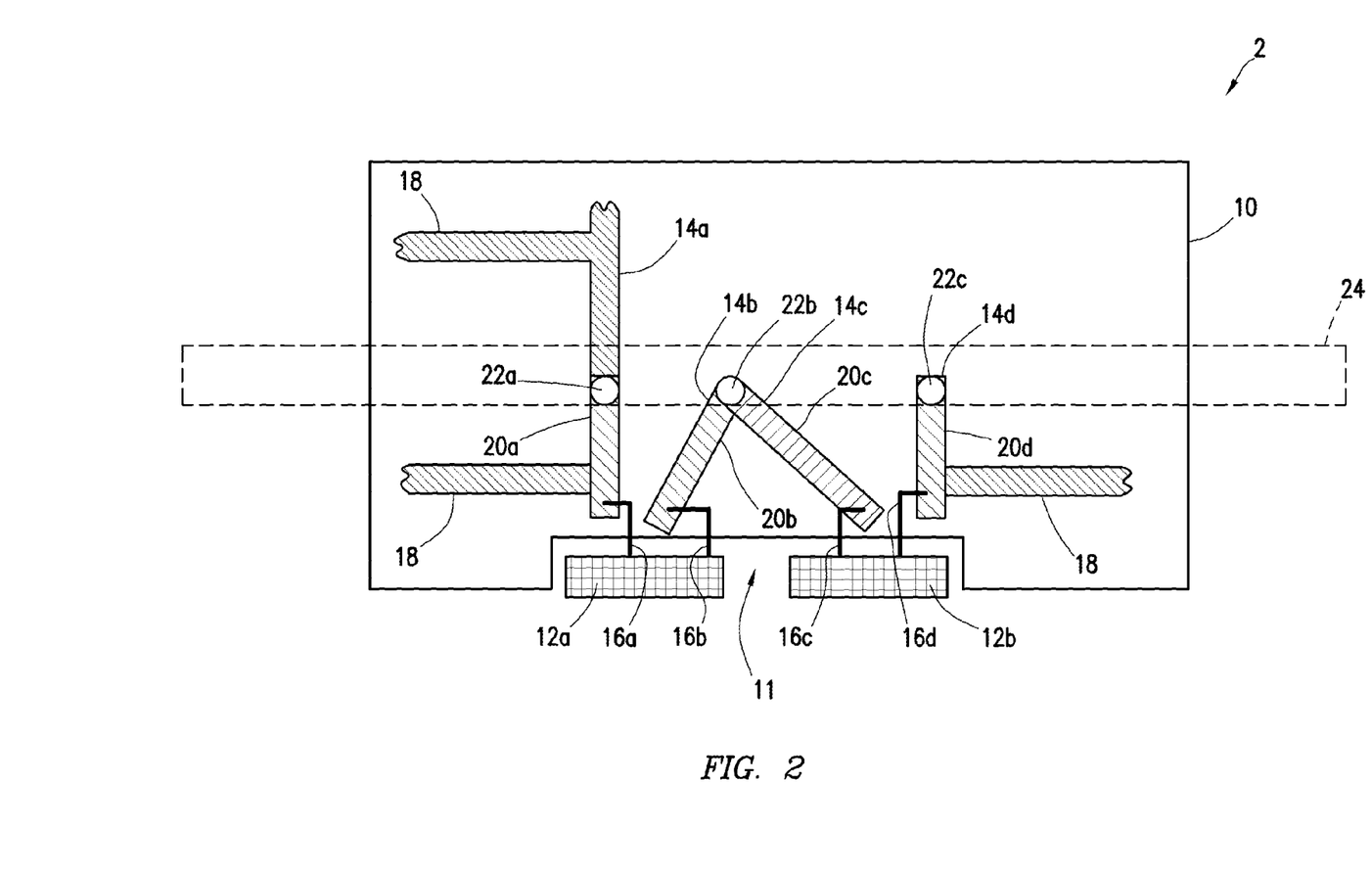
FIGS. 2 and 3 are diagrams showing an illustrative PCB assembly of the present disclosure in which electronic components are located off-board.
Figure 3:
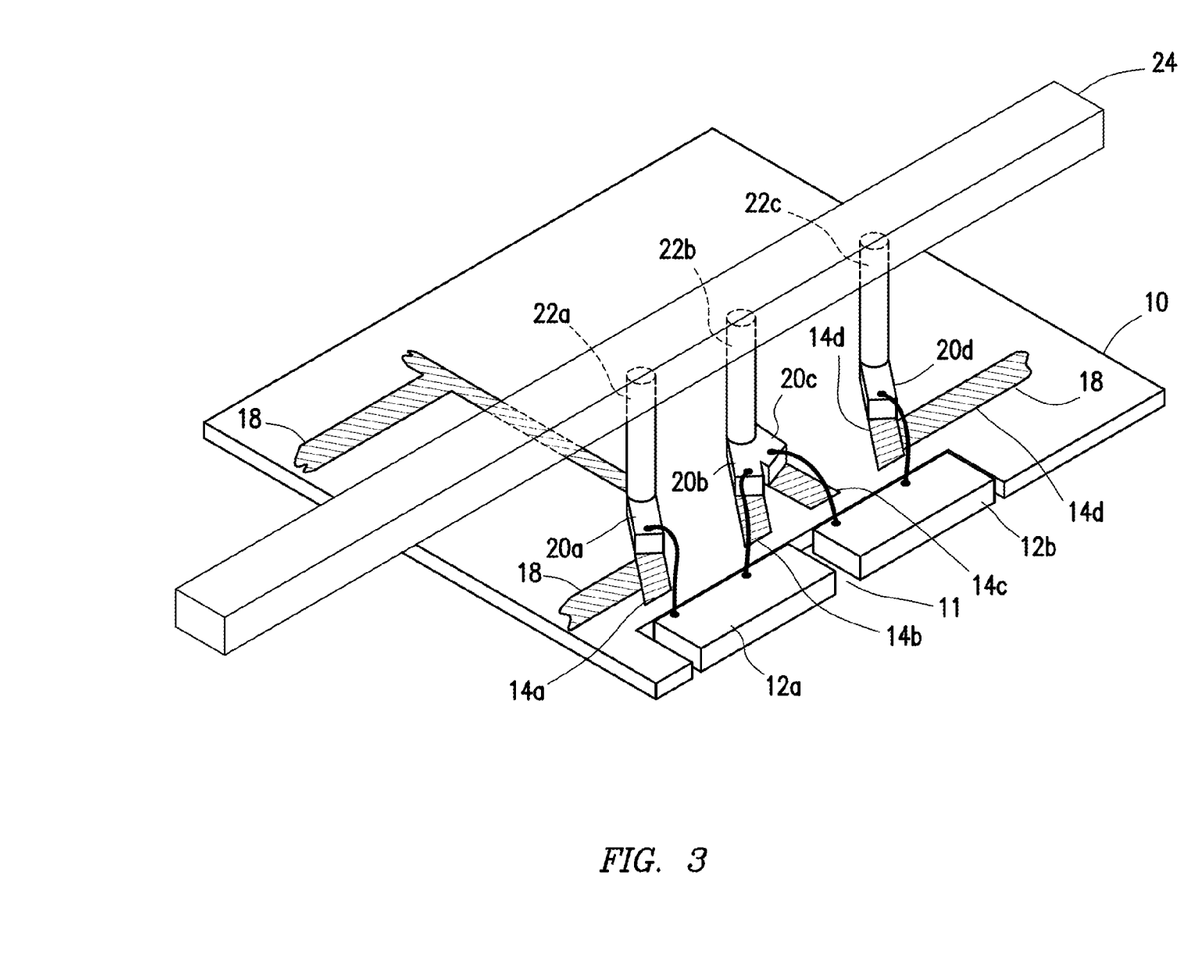

Turning to the drawings, FIGS. 1-3 are diagrams that show illustrative PCB assemblies of the present disclosure. FIGS. 1 and 2 show top views of illustrative PCB assemblies, and FIG. 3 shows an oblique side view of an illustrative PCB assembly.

As shown in FIG. 1, PCB assembly 1 contains electronic components 12a and 12b that are mounted upon non-conductive substrate 10. Electronic components 12a and 12b are in electrical communication with planar conductive pathways 14a-14d via leads 16a-16d that are directly attached to superficial metallic conductors 20a-20d. Electronic components 12a and 12b are configured to supply an electrical current to planar conductive pathways 14a-14d. Superficial metallic conductors 20a-20d overlay at least a portion of planar conductive pathways 14a-14d (also see FIG. 4). For example, superficial metallic conductors 20a and 20d partially overlay corresponding planar conductive pathways 14a and 14d in FIG. 1, and superficial metallic conductors 20b and 20c completely overlay corresponding planar conductive pathways 14b and 14c. Planar conductive pathways 14a and 14d may contain further branches 18, which may lead to additional circuitry or electronic components (not shown) located upon non-conductive substrate 10. The additional circuitry or electronic components may further contribute to the functionality of PCB assembly 1. The electrical connections established between leads 16a-16d and superficial metallic conductor 20a-20d may be through-hole or surface-mount, with the ultimate configuration being established based upon the board architecture and the experience of one having ordinary skill in the art.

Before proceeding further, it should be noted that the FIGURES herein simply provide illustrative layouts for the various components in the depicted embodiment. Accordingly, the FIGURES are not intended to depict a PCB assembly capable of performing any particular function and should be considered to be for purposes of illustration and not limitation. At least one electronic component may be in electrical communication with the planar conductive pathways of the PCB assemblies of the present disclosure and supply an electrical current thereto, with a maximum number of electronic components being determined, at least in part, by physical space constraints and desired operating characteristics. The layout and number of planar conductive pathways and branches extending therefrom should also be considered to be non-limiting and referenced for purposes of illustration only. Similarly, the layout, size, thickness and number of superficial metallic conductors overlaying the planar conductive pathways may be dictated based upon desired operating characteristics, such as the amount of current to be conveyed, and the depicted configuration should be considered non-limiting and referenced for purposes of illustration only.

Whereas planar conductive pathways 14a-14d may initially be insufficient to carry high currents supplied from electronic components 12a and 12b, superficial metallic conductors 20a-20d may provide a localized pathway for the current so that it can be withdrawn from PCB assembly 1, as discussed hereinafter. In addition to providing a pathway for conduction of high currents, superficial metallic conductors 20a-20d also maintain electrical communication with planar conductive pathways 14a-14d (i.e., the non-overlaid portions), thereby providing a low-current pathway suitable for performing other functions in PCB assembly 1.

In order to remove current within superficial metallic conductors 20a-20d, electrical communication may be established to bus bar 24 via electrically conductive standoffs 22a-22c. Electrically conductive standoffs 22a-22c may elevate bus bar 24 above PCB assembly 1, as better depicted in FIGS. 3 and 4. As used herein, the term "standoff" will refer to a conductive separator of defined length used to raise one component above another. As with the other components of PCB assembly 1, the number and disposition of standoffs extending between the superficial metallic conductors and the bus bar is not considered to be particularly limited. In alternative embodiments (not depicted), wires or other conductive elements may replace bus bar 24 and electrically conductive standoffs 22a-22c in order to accomplish current withdrawal in a related manner.

FIG. 2 shows an alternative configuration of a PCB assembly in which the electronic components are located "off-board." Specifically, FIG. 2 shows a diagram of PCB assembly 2 in which electronic components 12a and 12b are disposed within notch 11 defined within non-conductive substrate 10. When disposed off-board in notch 11, electronic components 12a and 12b may optionally be placed in thermal communication with a heat sink (not shown) to dissipate waste heat resulting from their operation. In addition, electronic components 12a and 12b that are located off-board may be placed above or below the plane of non-conductive substrate 10 at the operational discretion of a designer for PCB assembly 2.

FIG. 2 also shows an alternative configuration for branches 18, in which they directly contact the portions of planar conductive pathways 14a and 14d that are overlaid with superficial metallic conductors 20a and 20d, rather than a non-overlaid region as shown in FIG. 1. This configuration is not necessarily exclusive to an off-board disposition for electronic components 12a and 12b, and the depicted configuration should again be considered illustrative of the embodiments of the present disclosure and otherwise non-limiting. The remaining elements of FIG. 2 are substantially similar in nature to those of FIG. 1 and are enumerated with the same reference characters. Accordingly, these elements will not be described again herein in detail in the interest of brevity.

FIG. 3 shows an oblique side view of PCB assembly 3, in which the elevation of bus bar 24 by electrically conductive standoffs 22a-22c can be more clearly seen. Note that PCB assembly 3 contains combinations of the various features found in PCB assemblies 1 and 2, which are again enumerated with like reference numbers and will not be described in detail a second time in the interest of brevity.

Figure 4:
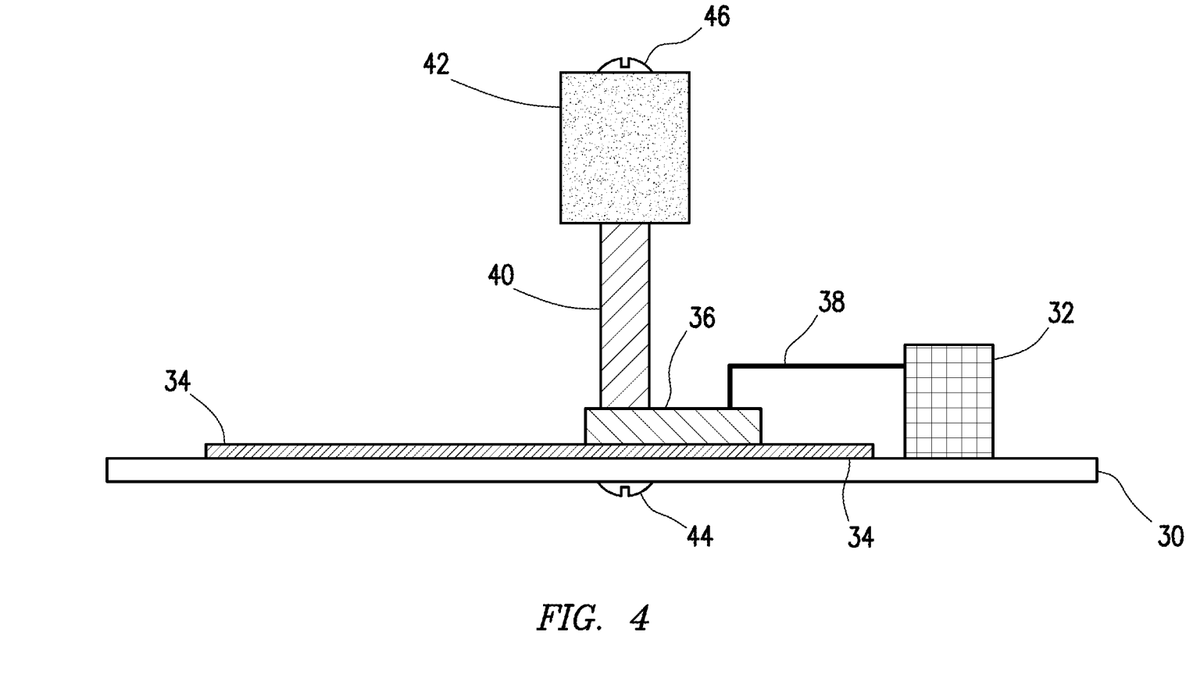
FIG. 4 shows a diagram of the connection between a single superficial metallic conductor and a bus bar.

FIG. 4 shows a diagram of the connection between a single superficial metallic conductor and a bus bar, as shown from a side view. As shown in FIG. 4, electronic component 32 is disposed upon non-conductive substrate 30. Planar conductive pathway 34 is disposed directly upon non-conductive substrate 30, with the elevation of planar conductive pathway 34 being exaggerated to more clearly illustrate the features described hereinafter. Superficial metallic conductor 36 overlays a portion of planar conductive pathway 34, thereby providing a flow pathway for high currents that is also in electrical communication with the remainder of planar conductive pathway 34. Lead 38 extends from electronic component 32 and establishes a direct electrical connection to superficial metallic conductor 36. As described above in reference to FIGS. 1-3, further branches may extend from various locations of planar conductive pathway 34, either in an overlaid region or in a non-overlaid region.

Continuing with FIG. 4, electrically conductive standoff 40 elevates bus bar 42 above the plane of the printed circuit board assembly and establishes electrical communication between superficial metallic conductor 36 and bus bar 42. Electrically conductive standoff 40 may be attached to superficial metallic conductor 36 and bus bar 42 through a mechanical connection in various embodiments. For example, as depicted in FIG. 4, screw 44 may extend through non-conductive substrate 30 and superficial metallic conductor 36 and mechanically affix standoff 40 in place. Similarly, screw 46 may extend through bus bar 42 and mechanically affix standoff 40 and bus bar 42 to one another. Other types of mechanical connections can be envisioned by one having ordinary skill in the art and will be described in more detail hereinbelow. Similarly, in alternative embodiments, standoff 40 may be non-mechanically attached to superficial metallic conductor 36 and/or bus bar 42, as will also be described in detail hereinbelow.

Although the foregoing FIGURES have depicted single-sided PCB assemblies, it is to be recognized that similar double-sided and multi-layered PCB assemblies may also be constructed. A double-sided PCB assembly, for example, may be constructed by affixing a superficial metallic conductor onto both sides of a double-sided PCB and completing the fabrication of each side of the PCB as described herein. Similarly, multi-layered PCB assemblies may be fabricated by stacking either single-sided or double-sided PCB assemblies of the present disclosure together with one another.

Accordingly, in various embodiments, PCB assemblies of the present disclosure may comprise: a non-conductive substrate having a plurality of planar conductive pathways disposed thereon; an electronic component that is in electrical communication with one or more of the planar conductive pathways and is configured to supply an electrical current thereto; a superficial metallic conductor overlaying one or more of the planar conductive pathways, at least in part, the superficial metallic conductor having a direct electrical connection to the electronic component and also being in electrical communication with the planar conductive pathways; and a conductive element in electrical communication with the superficial metallic conductor, the conductive element being configured to withdraw electrical current from the printed circuit board assembly.

As referenced above, the PCB assemblies of the present disclosure may be fabricated, in part, through post-production modification of PCBs that have been initially produced using conventional techniques and equipment. Accordingly, methods for preparing a PCB assembly of the present disclosure may initially comprise defining the planar conductive pathways upon the non-conductive substrate through either additive or subtractive techniques. Additive techniques may include processes such as inkjet printing, for example. Subtractive techniques may include depositing a metal film or sheet upon substantially the entirety of the non-conductive substrate, masking and then etching away portions of the metal to define the planar conductive pathways in a desired location and pattern. Once the planar conductive pathways have been defined upon the non-conductive substrate, the superficial metallic conductor, the conductive element and any additional components may be added to the PCB assembly as further described herein. The electronic component may be introduced and electrically connected to the superficial metallic conductor once the latter component has been set in place upon the planar conductive pathways.

The electronic component in electrical communication with the planar conductive pathways via the superficial metallic conductor may include, but is not limited to, resistors, capacitors, transistors (e.g., metal oxide-semiconductor field-effect transistors (MOSFETs), insulated gate bipolar transistors (IGBTs), junction-gate field-effect transistors (JFETs), and the like), diodes, integrated circuit chips, the like and any combination thereof. The type, size, number and shape of the electronic component(s) supplying current to the printed circuit board assembly is not considered to be particularly limited and may depend on a number of factors that will be familiar to one having ordinary skill in the art. Determining factors may include, but are not limited to, the configuration of the PCB, the type(s) of power component(s), and the like. In more particular embodiments, the electronic component can be a high-current electronic device that is directly connected to the superficial metallic conductor. In illustrative embodiments, the high-current electronic component may comprise a MOSFET or diode comprising silicon carbide. Illustrative high-current electronic components may include, for example, TO-220 and TO-247 components, which are high-power silicon carbide devices produced by various manufacturers, such as Vishay Technologies, International Rectifier, ST Microelectronics, Cree Inc. or Microsemi.

As discussed above, the electronic component may be disposed on the non-conductive substrate in some embodiments. In other embodiments, the electronic component may be placed "off-board" but in sufficient proximity to the superficial metallic conductor, such that an electrical connection may be established therebetween. For example, an off-board electronic component may be positioned within a cutout defined in the non-conductive substrate. When positioned within a cutout, the electronic component may be disposed substantially in plane with the non-conductive substrate or substantially out-of-plane with the non-conductive substrate. Optionally, an off-board electronic component may be placed in thermal communication with a heat sink.

The planar conductive pathways disposed upon the non-conductive substrate are not considered to be particularly limited in composition. In illustrative embodiments, the planar conductive pathways may comprise copper or a copper alloy. Additional metals that may be suitable for forming the planar conductive pathways include other highly conductive metals, such as gold and/or silver, either of which may be alloyed with copper. Further, the physical configuration of the planar conductive pathways is not considered to be particularly limited and may be established at the discretion of one having ordinary skill in the art in view of particular design and functionality constraints. In still further illustrative embodiments, the planar conductive pathways may have a height of up to about 100 microns with respect to the non-conductive substrate.

As discussed above, the superficial metallic conductor overlays the planar conductive pathways, at least in part, so as to establish electrical communication thereto. In more particular embodiments, the superficial metallic conductor may comprise a metal sheet or metal monolith that overlays at least a portion of a planar conductive pathway. A metal sheet may have a thickness that is substantially smaller than its planar dimensions. For example, the superficial metallic conductor may comprise a copper sheet in some embodiments. The shape and thickness of the superficial metallic conductor may be chosen to establish effective electrical communication with the underlying planar conductive pathways and to handle an expected amount of current supplied from the electronic component attached thereto. The shape and thickness of the superficial metallic conductor may further be chosen to accommodate various PCB architectural and manufacturing requirements.

As with the planar conductive pathways, the composition of the superficial metallic conductor is not considered to be particularly limited and may include highly conductive metals such as copper, gold and/or silver. In particular embodiments, the superficial metallic conductor may comprise the same metal as in the planar conductive pathways. When the metals are the same, particularly good adhesion may be attained between the planar conductive pathways and the superficial metallic conductor upon lamination of these components to one another. In alternative embodiments, the superficial metallic conductor may comprise a different metal than that of the planar conductive pathways.

In other various embodiments, the superficial metallic conductor may comprise a metal sheet that comprises a base metal and a surface plating of a second metal. Functions of the surface plating may include, for example, to increase conductivity of the superficial metallic conductor, to increase adhesion to the planar conductive pathways, and/or to increase oxidation or corrosion resistance of the superficial metallic conductor. In particular embodiments, the base metal may comprise copper. In other particular embodiments, the surface plating may comprise tin, nickel, palladium, gold, any combination thereof in any plating order, or any alloyed combination thereof. In illustrative embodiments, the surface plating may comprise a nickel layer, a palladium layer on the nickel layer, and a gold layer upon the palladium layer, all disposed upon an underlying base metal.

In more particular embodiments, the superficial metallic conductor may be laminated onto an underlying planar conductive pathway. The superficial metallic conductor may be laminated onto the underlying planar conductive pathway in any suitable manner that maintains electrical communication between the superficial metallic conductor and the underlying planar conductive pathways. In illustrative embodiments, suitable techniques for laminating the superficial metallic conductor to the PCB assembly may include, for example, soldering, brazing, gluing, mechanical coupling, and the like. Soldering-based techniques may be advantageous for laminating the superficial metallic conductor onto the underlying planar conductive pathway, since the superficial metallic conductor may become an integral part of the planar conductive pathways, essentially extending the overlaid portions of the planar conductive pathways upwardly, such that there is a decreased or non-existent interface between the two. In this regard, alloying may occur between the metal(s) in the planar conductive pathways, the superficial metallic conductor and the metals in the soldering paste. Soldering-based techniques may also allow for good electrical communication to be maintained between the planar conductive pathways and the superficial metallic conductor, unlike gluing or mechanical coupling techniques, which may still result in electrical communication, but to a decreased degree. Soldering-based techniques may also allow for surface-mount assembly processes to take place by reflowing solder upon the underlying planar conductive pathway. Brazing-based techniques may operate similarly to soldering-based techniques, but the higher temperatures usually associated with brazing may be problematic, particularly toward the non-conductive substrate.

In some embodiments, the superficial metallic conductor may match the underlying planar conductive pathway in shape. That is, the superficial metallic conductor may directly overlay the planar conductive pathway such that the superficial metallic conductor does not extend substantially onto the non-conductive substrate. In other various embodiments, the superficial metallic conductor may overlay both the planar conductive pathway in a desired region and at least a portion of the surrounding non-conductive substrate. By extending the superficial metallic conductor onto the surrounding substrate, the superficial metallic conductor's effective area can be significantly increased over that of the underlying planar conductive pathways, thereby providing for higher ampacity, enabling more ready manipulation of the superficial metallic conductor, and easier establishment of an electrical connection from the electronic component. In still other alternative embodiments, the underlying planar conductive pathways may be larger in size than the superficial metallic conductor.

As discussed above, the PCB assemblies of the present disclosure may comprise a conductive element that is configured for carrying high currents from the superficial metallic conductor and withdrawing the currents from the PCB. In various embodiments, the conductive element may comprise a bus bar or a wire that is in electrical communication with the superficial metallic conductor through a direct or indirect connection thereto.

In more particular embodiments, the conductive element may comprise a bus bar. The bus bar may comprise various high-conductivity metals or metal alloys such as copper, brass, aluminum or the like. One having ordinary skill in the art may envision other highly conductive metals suitable for forming a bus bar in the embodiments of the present disclosure. The bus bar may be in the form of a strip or a hollow tube, or any other shape that allows heat to dissipate efficiently due to a high ratio of surface area to cross-sectional area. In some embodiments, the bus bar may comprise a multilayered structure having metallic layers (e.g., copper) that are separated by insulator layers. In alternative embodiments, the bus bar may comprise a monolithic metal structure. The cross-sectional area of the bus bar can determine the amount of current that can be safely carried by it. Accordingly, the intended application of the PCB assembly may dictate the type and configuration of bus bar that is used.

In some embodiments, the bus bar may be disposed directly upon the superficial metallic conductor. Although the bus bar is elevated above the non-conductive substrate in such embodiments and may carry current from the superficial metallic conductor, this configuration for the bus bar leaves minimal room for disposition of other components on the PCB assembly under the bus bar. In addition, such a bus bar configuration may lack a desired degree of mechanical robustness.

In other various embodiments, the bus bar may be elevated above a surface of the non-conductive substrate with an electrically conductive standoff that establishes electrical communication between the superficial metallic conductor and the bus bar. The electrically conductive standoff may be of any suitable height to elevate the bus bar a desired distance above the plane of the non-conductive substrate. Likewise, the electrically conductive standoff may have a cross-sectional area that is sufficient to accommodate the anticipated current passing through the superficial metallic conductor. The cross-sectional geometry of the electrically conductive standoff is not considered to be particularly limited and may be, for example, circular, ellipsoidal, or prismatic (e.g., cube-shaped, cuboid-shaped, triangular prism-shaped, hexagonal prism-shaped, hexagonal prism-shaped, any combination thereof, and the like). Irregular cross-sectional geometries may also be used.

At least one electrically conductive standoff may extend between each superficial metallic conductor and the bus bar so as to establish electrical communication therebetween. If greater electrical conduction and/or increased mechanical support of the bus bar is/are desired, additional electrically conductive standoffs may be employed. For example, in some embodiments, two electrically conductive standoffs may extend from one or more of the superficial metallic conductors to the bus bar. Likewise, the total number of electrically conductive standoffs extending to the bus bar is not considered to have an upper limit, except as otherwise imposed by design constraints of the PCB assembly.

In some embodiments, the electrically conductive standoff may be mechanically coupled to the superficial metallic conductor and the bus bar. Suitable mechanical coupling techniques may include, for example, screws, bolts, brads, pins, compression fittings, swage fittings and the like. As used herein, the terms "swage" and grammatical variants thereof will refer to a forging process in which the dimensions of an item are altered using dies into which the item is forced, and which encompasses both cold working and hot working processes. In some embodiments, the electrically conductive standoff may contain at least one female fitting configured to accept a screw, bolt, pin or like fitting therein. The female fitting may extend partially through the length of the electrically conductive standoff or extend completely therethrough, thereby defining a bore. For example, a bolt may be inserted through the bus bar (or the non-conductive substrate) and extend completely through the electrically conductive standoff and non-conductive substrate (or the bus bar) in order to connect these elements together. Alternately, screws or similar fittings may be inserted through the bus bar and the non-conductive substrate in order to hold the electrically conductive standoff in place from both ends. Further alternately, in some embodiments, the electrically conductive standoff may comprise a male fitting configured to establish mechanical coupling to the non-conductive substrate or the bus bar. For example, in some embodiments, the electrically conductive standoff may have at least one end configured with male screw threads or the like.

In other various embodiments, the superficial metallic conductor and the bus bar may be soldered to the electrically conductive standoff.

The illustrative PCB assemblies described hereinabove may also be incorporated within wellbore systems to accomplish various functions therein. In particular, the PCB assemblies described hereinabove may be in electrical communication with a downhole tool, thereby facilitating its operation. The PCB assemblies may be incorporated directly within the downhole tool itself, or they may be electrically connected to the downhole tool through an external connection. In either case, the PCB assemblies may be deployed downhole along with the tool. In this regard, structural robustness of the PCB assemblies described hereinabove can make them particularly suitable for deployment in a downhole environment.

In more specific embodiments, wellbore systems of the present disclosure may comprise: a downhole tool; and a printed circuit board assembly in electrical communication with the downhole tool. The printed circuit board assembly comprises: a non-conductive substrate having a plurality of planar conductive pathways disposed thereon; an electronic component that is in electrical communication with one or more of the planar conductive pathways and is configured to supply an electrical current thereto; a superficial metallic conductor overlaying one or more of the planar conductive pathways, at least in part, the superficial metallic conductor having a direct electrical connection to the electronic component and also being in electrical communication with the planar conductive pathways; and a conductive element in electrical communication with the superficial metallic conductor, the conductive element being configured to withdraw electrical current from the printed circuit board assembly. The conductive element may comprise a bus bar or wire that is connected directly or indirectly to the superficial metallic conductor.

In various embodiments, the downhole tool may be electronically controllable. As used herein, the term "electronically controllable" will refer to a tool whose operation changes based upon an input of electrical current from a source. Operational changes that may occur upon an input of electrical current may include, for example, a sensing function, a change in operating state, mechanical actuation, start up, shut down, or the like.

In some embodiments, the downhole tool may comprise a downhole electronic device that receives an electrical input from a power source. In more particular embodiments, the downhole tool may be responsive to a change in the electrical input, as controlled by the printed circuit board assembly. In still more particular embodiments, suitable downhole tools may comprise logging while drilling tools, measurement while drilling tools, rotary steerable drilling tools, or sensors. The type of downhole tool may determine the architecture of the PCB assembly used for controlling the tool.

For example, in illustrative embodiments, the downhole tool may comprise a rotary steerable drilling tool containing a printed circuit board assembly of the present disclosure. The rotary steerable drilling tool may comprise a turbine, a power generator mechanically coupled to the turbine, and a control electronics module housing various electronic components in electrical communication with the turbine. One or more PCB assemblies of the present disclosure may be electrically coupled to an electronic component within the control electronics module. The rotary steerable drilling tool may further comprise a drive motor and a steering head in electrical communication with the control electronics module. These components may, in turn, provide directionality to a drill bit located at the terminus of the rotary steerable drilling tool.

Illustrative disclosure regarding drilling processes in which the PCB assemblies of the present disclosure may be employed follows hereinbelow.

Figure 5:
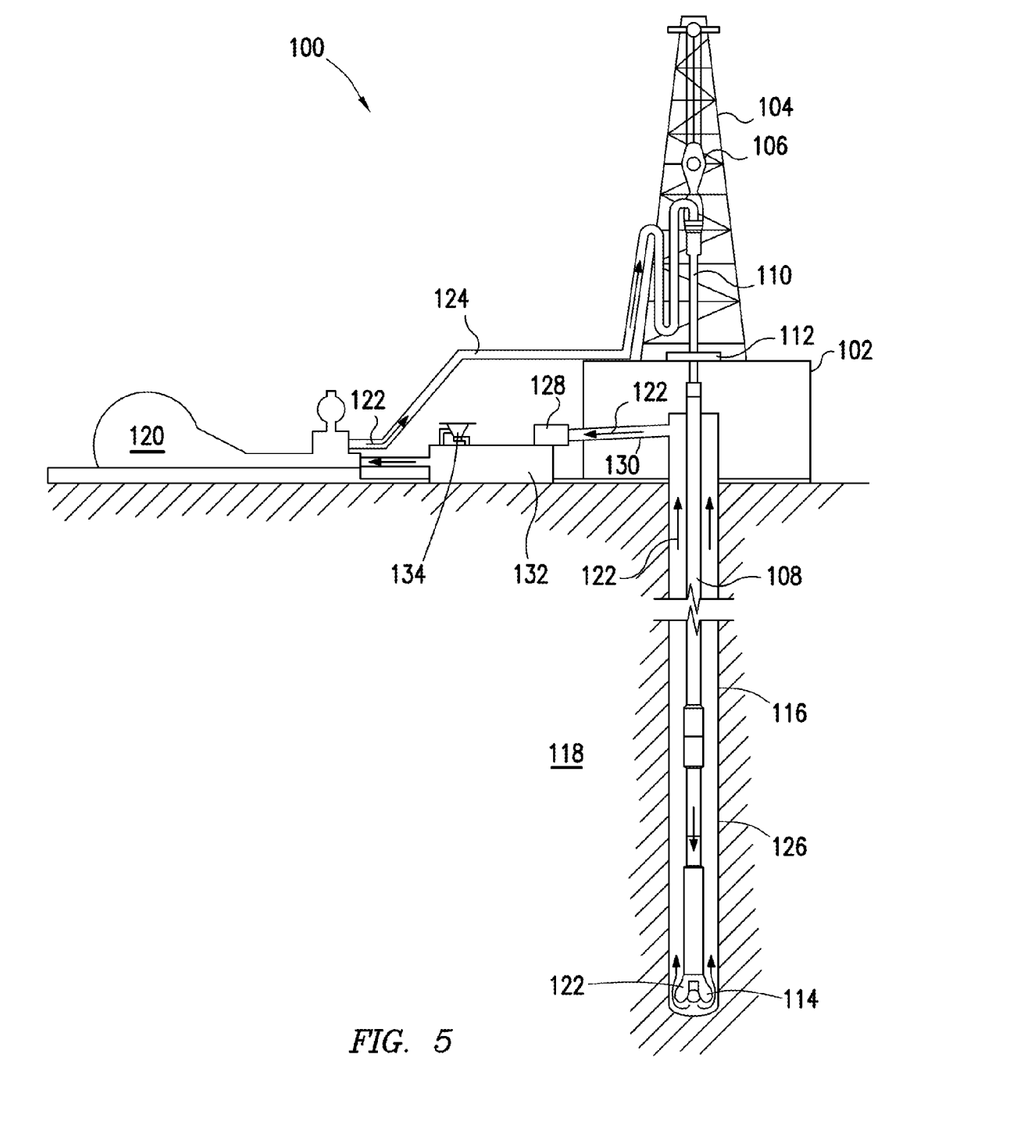
FIG. 5 shows a diagram of an illustrative drilling assembly.

FIG. 5 shows a diagram of an illustrative drilling assembly. While FIG. 5 generally depicts a land-based drilling assembly, one having ordinary skill in the art will readily recognize that the principles described herein are equally applicable to subsea drilling operations that employ floating or sea-based platforms and rigs, without departing from the scope of the disclosure.

As illustrated, drilling assembly 100 may include drilling platform 102 that supports derrick 104 having traveling block 106 for raising and lowering drill string 108. Drill string 108 may include, but is not limited to, drill pipe and coiled tubing, as generally known by one having ordinary skill in the art. Kelly 110 supports drill string 108 as it is lowered through rotary table 112. Drill bit 114 is attached to the distal end of drill string 108 and is driven either by a downhole motor and/or via rotation of drill string 108 from the well surface. As drill bit 114 rotates, it creates borehole 116 that penetrates various subterranean formations 118. A printed circuit board assembly of the present disclosure may be housed at an arbitrary location within drill string 108.

Pump 120 (e.g., a mud pump) circulates drilling fluid 122 through feed pipe 124 and to kelly 110, which conveys drilling fluid 122 downhole through the interior of drill string 108 and through one or more orifices in drill bit 114. Drilling fluid 122 is then circulated back to the surface via annulus 126 defined between drill string 108 and the walls of borehole 116. At the surface, the recirculated or spent drilling fluid 122 exits annulus 126 and may be conveyed to one or more fluid processing unit(s) 128 via interconnecting flow line 130. After passing through fluid processing unit(s) 128, a "cleaned" drilling fluid 122 is deposited into nearby retention pit 132 (i.e., a mud pit). While illustrated as being arranged at the outlet of wellbore 116 via annulus 126, one having ordinary skill in the art will readily appreciate that fluid processing unit(s) 128 may be arranged at any other location in drilling assembly 100 to facilitate its proper function, without departing from the scope of the disclosure.

Drilling fluid 122 may be formulated in mixing hopper 134 that is communicably coupled to or otherwise in fluid communication with retention pit 132. Mixing hopper 134 may include, but is not limited to, mixers and related mixing equipment known to a person having ordinary skill in the art. In at least one embodiment, for example, there could be more than one retention pit 132, such as multiple retention pits 132 in series. Moreover, retention pit 132 may be representative of one or more fluid storage facilities and/or units where drilling fluid 122 may be stored, reconditioned, and/or regulated.

Drilling fluid 122 may directly or indirectly affect the components and equipment of drilling assembly 100. For example, drilling fluid 122 may directly or indirectly affect fluid processing unit(s) 128 which may include, but are not limited to, one or more of a shaker (e.g., shale shaker), a centrifuge, a hydrocyclone, a separator (including magnetic and electrical separators), a desilter, a desander, a separator, a filter (e.g., diatomaceous earth filters), a heat exchanger, and any fluid reclamation equipment. Fluid processing unit(s) 128 may further include one or more sensors, gauges, pumps, compressors, and the like used to store, monitor, regulate, and/or recondition the exemplary drilling fluids.

Drilling fluid 122 may directly or indirectly affect pump 120, which representatively includes any conduits, pipelines, trucks, tubulars, and/or pipes used to fluidically convey the drilling fluids downhole, any pumps, compressors, or motors (e.g., topside or downhole) used to drive the drilling fluids into motion, any valves or related joints used to regulate the pressure or flow rate of the drilling fluids, and any sensors (i.e., pressure, temperature, flow rate, etc.), gauges, and/or combinations thereof, and the like. Drilling fluid 122 may also directly or indirectly affect mixing hopper 134 and retention pit 132 and their assorted variations.

Drilling fluid 122 may also directly or indirectly affect the various downhole equipment and tools that may come into contact with the drilling fluids such as, but not limited to, drill string 108, any floats, drill collars, mud motors, downhole motors and/or pumps associated with drill string 108, and any MWD/LWD tools and related telemetry equipment, sensors or distributed sensors associated with drill string 108. These tools, in turn, may affect the architecture of the PCB assembly deployed within drill string 108. Drilling fluid 122 may also directly or indirectly affect any downhole heat exchangers, valves and corresponding actuation devices, tool seals, packers and other wellbore isolation devices or components, and the like associated with wellbore 116. Drilling fluid 122 may also directly or indirectly affect drill bit 114, which may include, but is not limited to, roller cone bits, PDC bits, natural diamond bits, any hole openers, reamers, coring bits, and the like.

While not specifically illustrated herein, drilling fluid 122 may also directly or indirectly affect any transport or delivery equipment used to convey the drilling fluids to drilling assembly 100 such as, for example, any transport vessels, conduits, pipelines, trucks, tubulars, and/or pipes used to fluidically move the drilling fluids from one location to another, any pumps, compressors, or motors used to drive the drilling fluids into motion, any valves or related joints used to regulate the pressure or flow rate of the drilling fluids, and any sensors (i.e., pressure and temperature), gauges, and/or combinations thereof, and the like.

Embodiments disclosed herein include:

A. Printed circuit board (PCB) assemblies. The PCB assemblies comprise: a non-conductive substrate having a plurality of planar conductive pathways disposed thereon; an electronic component that is in electrical communication with one or more of the planar conductive pathways and is configured to supply an electrical current thereto; a superficial metallic conductor overlaying one or more of the planar conductive pathways, at least in part, the superficial metallic conductor having a direct electrical connection to the electronic component and also being in electrical communication with the planar conductive pathways; and a conductive element in electrical communication with the superficial metallic conductor, the conductive element being configured to withdraw electrical current from the printed circuit board assembly.

B. Wellbore systems containing a PCB assembly. The wellbore systems comprise: a downhole tool; and a printed circuit board assembly in electrical communication with the downhole tool, the printed circuit board assembly comprising: a non-conductive substrate having a plurality of planar conductive pathways disposed thereon; an electronic component that is in electrical communication with one or more of the planar conductive pathways and is configured to supply an electrical current thereto; a superficial metallic conductor overlaying one or more of the planar conductive pathways, at least in part, the superficial metallic conductor having a direct electrical connection to the electronic component and also being in electrical communication with the planar conductive pathways; and a conductive element in electrical communication with the superficial metallic conductor, the conductive element being configured to withdraw electrical current from the printed circuit board assembly.

Each of embodiments A and B may have one or more of the following additional elements in any combination:

Element 1: wherein the superficial metallic conductor is laminated onto an underlying planar conductive pathway.

Element 2: wherein the superficial metallic conductor matches the underlying planar conductive pathway in shape.

Element 3: wherein the superficial metallic conductor is soldered or brazed to the underlying planar conductive pathway.

Element 4: wherein the superficial metallic conductor comprises a metal sheet.

Element 5: wherein the metal sheet comprises a copper sheet.

Element 6: wherein the metal sheet comprises a base metal and is surface-plated with a second metal.

Element 7: wherein the conductive element comprises a bus bar elevated above a surface of the non-conductive substrate by an electrically conductive standoff that establishes electrical communication between the superficial metallic conductor and the bus bar.

Element 8: wherein the electrically conductive standoff is mechanically coupled to the superficial metallic conductor and the bus bar.

Element 9: wherein the electronic component is disposed on the non-conductive substrate.

Element 10: wherein the downhole tool comprises a logging while drilling tool, a measurement while drilling tool, a rotary steerable drilling tool, or a sensor.

The printed circuit board assembly of A or the wellbore system of B in combination with elements 1 and 4, optionally in combination with element 10 in the wellbore system of B.

The printed circuit board assembly of A or the wellbore system of B in combination with elements 4 and 5, optionally in combination with element 10 in the wellbore system of B.

The printed circuit board assembly of A or the wellbore system of B in combination with elements 4 and 6, optionally in combination with element 10 in the wellbore system of B.

The printed circuit board assembly of A or the wellbore system of B in combination with elements 1 and 7, optionally in combination with element 10 in the wellbore system of B.

The printed circuit board assembly of A or the wellbore system of B in combination with elements 7 and 8, optionally in combination with element 10 in the wellbore system of B.

The printed circuit board assembly of A or the wellbore system of B in combination with elements 7 and 9, optionally in combination with element 10 in the wellbore system of B.

The printed circuit board assembly of A or the wellbore system of B in combination with elements 2, 4 and 5, optionally in combination with element 10 in the wellbore system of B.

The printed circuit board assembly of A or the wellbore system of B in combination with elements 2, 4 and 6, optionally in combination with element 10 in the wellbore system of B.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the specification and attached claims are approximations that may vary depending upon the desired properties sought to be obtained by the embodiments of the present disclosure. At the very least, and not as an attempt to limit the application of the doctrine of equivalents to the scope of the claim, each numerical parameter should at least be construed in light of the number of reported significant digits and by applying ordinary rounding techniques.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The disclosure illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The invention claimed is:

1. A printed circuit board assembly comprising:
a non-conductive substrate having a plurality of planar conductive pathways disposed thereon;
an electronic component that is in electrical communication with one or more of the planar conductive pathways and is configured to supply an electrical current thereto;
a superficial metallic conductor overlaying one or more of the planar conductive pathways, at least in part, the superficial metallic conductor being electrically connected to the electronic component via one or more leads attached to the superficial metallic conductor and the electronic component; and
wherein the superficial metallic conductor is also in electrical communication with the planar conductive pathways;
a current-withdrawing conductive element in electrical communication with the superficial metallic conductor, and
wherein the current-withdrawing conductive element comprises a bus bar elevated above a surface of the non-conductive substrate by an electrically conductive standoff that establishes electrical communication between the superficial metallic conductor and the bus bar.

2. The printed circuit board assembly of claim 1, wherein the superficial metallic conductor is laminated onto an underlying planar conductive pathway.

3. The printed circuit board assembly of claim 1, wherein the superficial metallic conductor comprises a metal sheet.

4. The printed circuit board assembly of claim 1, wherein the electrically conductive standoff is mechanically coupled to the superficial metallic conductor and the bus bar.

5. The printed circuit board assembly of claim 1, wherein the electronic component is disposed on the non-conductive substrate.

6. The printed circuit board assembly of claim 2, wherein the superficial metallic conductor matches the underlying planar conductive pathway in shape.

7. The printed circuit board assembly of claim 2, wherein the superficial metallic conductor is soldered or brazed to the underlying planar conductive pathway.

8. The printed circuit board assembly of claim 3, wherein the metal sheet comprises a copper sheet.

9. The printed circuit board assembly of claim 3, wherein the metal sheet comprises a base metal and is surface-plated with a second metal.

10. A wellbore system comprising:
a downhole tool; and
a printed circuit board assembly in electrical communication with the downhole tool, the printed circuit board assembly comprising:
a non-conductive substrate having a plurality of planar conductive pathways disposed thereon;
an electronic component that is in electrical communication with one or more of the planar conductive pathways and is configured to supply an electrical current thereto;
a superficial metallic conductor overlaying one or more of the planar conductive pathways, at least in part, the superficial metallic conductor being electrically connected to the electronic component via one or more leads attached to the superficial metallic conductor and the electronic component: and
wherein the superficial metallic conductor is also in electrical communication with the planar conductive pathways;
a current-withdrawing conductive element in electrical communication with the superficial metallic conductor, and
wherein the current-withdrawing conductive element comprises a bus bar elevated above a surface of the non-conductive substrate by an electrically conductive standoff that establishes electrical communication between the superficial metallic conductor and the bus bar.

11. The wellbore system of claim 10, wherein the downhole tool comprises a logging while drilling tool, a measurement while drilling tool, a rotary steerable drilling tool, or a sensor.

12. The wellbore system of claim 10, wherein the superficial metallic conductor is laminated onto an underlying planar conductive pathway.

13. The wellbore system of claim 10, wherein the superficial metallic conductor comprises a metal sheet.

14. The wellbore system of claim 10, wherein the electrically conductive standoff is mechanically coupled to the superficial metallic conductor and the bus bar.

15. The wellbore system of claim 10, wherein the electronic component is disposed on the non-conductive substrate.

16. The wellbore system of claim 10, wherein the bus bar and the one or more planar conductive pathways are located on the same side of the non-conductive substrate.

17. The wellbore system of claim 12, wherein the superficial metallic conductor matches the underlying planar conductive pathway in shape.

18. The wellbore system of claim 12, wherein the superficial metallic conductor is soldered or brazed to the underlying planar conductive pathway.

19. The wellbore system of claim 13, wherein the metal sheet comprises a copper sheet.

* * * * *